(12) United States Patent
Damron et al.

(10) Patent No.: US 6,752,315 B1
(45) Date of Patent: Jun. 22, 2004

(54) DETECTOR ASSEMBLY FOR USE IN A BAR CODE SCANNER AND METHODS FOR FABRICATING THE SAME

(75) Inventors: Steven Wayne Damron, Woodstock, GA (US); Paul Oliver Detwiler, Lawrenceville, GA (US)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 10/324,748

(22) Filed: Dec. 19, 2002

(51) Int. Cl.$^7$ .................................................. G06K 7/10
(52) U.S. Cl. ............. 235/454; 235/462.06; 235/462.35
(58) Field of Search ........................... 235/454, 462.06, 235/462.35, 462.42; 250/566, 216; 359/885, 359, 360, 588

(56) References Cited

U.S. PATENT DOCUMENTS

| | | | | |
|---|---|---|---|---|
| 4,013,915 A | * | 3/1977 | Dufft ............................ | 313/499 |
| 4,422,714 A | * | 12/1983 | Benoit et al. .................. | 385/39 |
| 4,687,282 A | * | 8/1987 | Ferrante ....................... | 235/457 |
| 4,786,798 A | * | 11/1988 | Lonsdale ....................... | 250/216 |
| 4,823,170 A | * | 4/1989 | Hansen ......................... | 356/620 |
| 5,057,687 A | * | 10/1991 | Leyshon et al. ............... | 250/239 |
| 5,337,191 A | * | 8/1994 | Austin ........................... | 359/885 |
| 5,486,688 A | * | 1/1996 | Iima et al. ................ | 235/462.11 |
| 5,777,314 A | * | 7/1998 | Roustaei ................ | 235/462.42 |
| 5,969,323 A | * | 10/1999 | Gurevich et al. ....... | 235/462.06 |
| 6,147,358 A | * | 11/2000 | Hecht ........................... | 250/566 |
| 6,324,418 B1 | * | 11/2001 | Crowley et al. ............. | 600/476 |

* cited by examiner

*Primary Examiner*—Diane I. Lee
*Assistant Examiner*—Kumiko C. Koyama
(74) *Attorney, Agent, or Firm*—Priest & Goldstein, PLLC

(57) ABSTRACT

An improved detector assembly restricting light striking a detector within the assembly to a relatively narrow bandwidth and techniques for fabricating the same. A pliable material is impregnated with a coloring agent selected so that the material provides a filtering effect admitting light within a range including a predetermined wavelength, with the wavelength having a value based on a wavelength of a laser to be employed with the detector assembly. The pliable material is shaped so as form a capsule enclosing a detector, with the capsule including a hemispherical lens element as an integral part of the capsule. The hemispherical lens element is coated with a filter coating selected to provide a filtering effect complementary to that provided by the coloring agent, such that the combined filtering effects provided by the filter coating and the coloring agent provide a bandpass filtering effect.

20 Claims, 2 Drawing Sheets

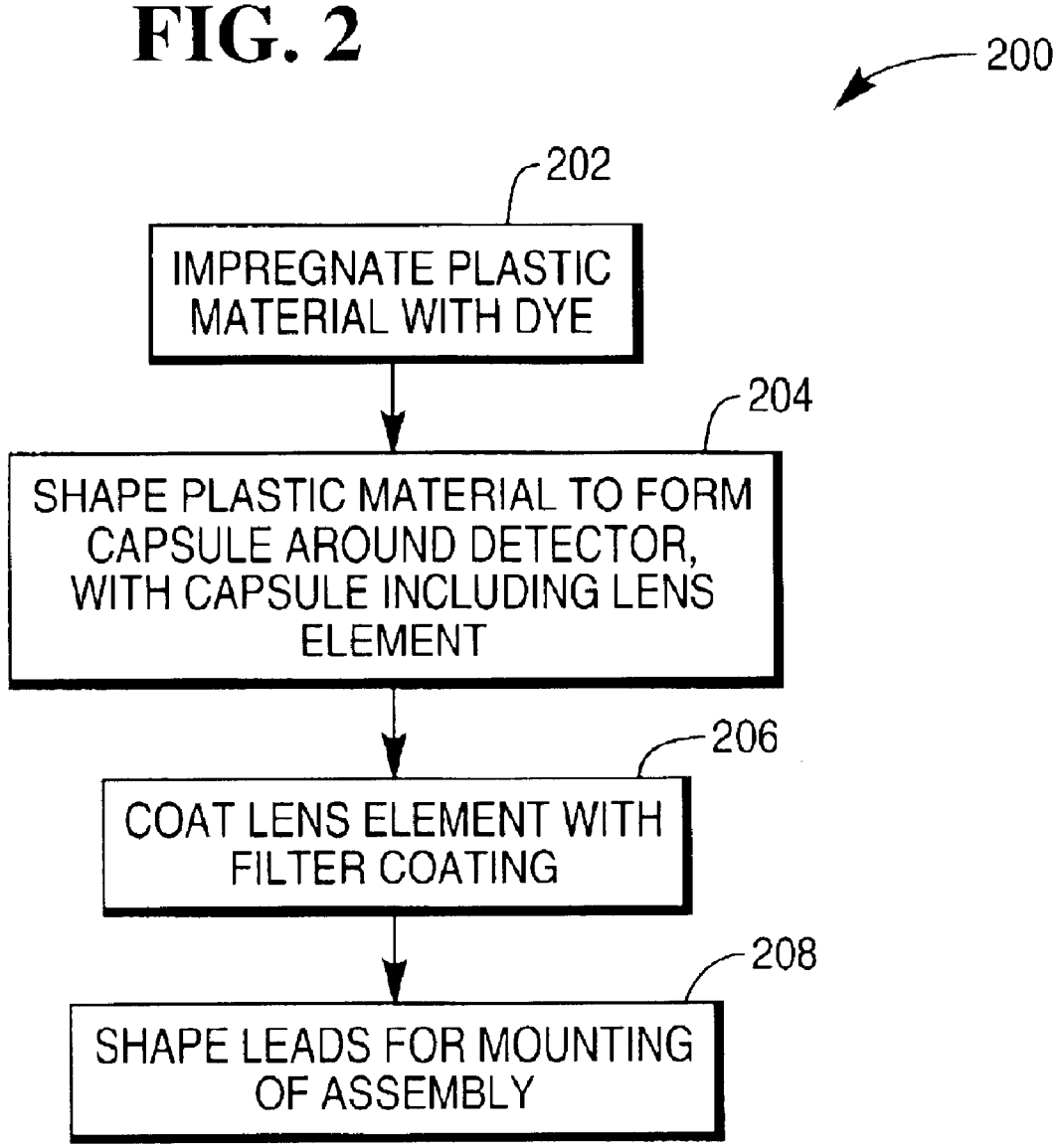

DETECTOR ASSEMBLY FOR USE IN A BAR CODE SCANNER AND METHODS FOR FABRICATING THE SAME

FIELD OF THE INVENTION

The present invention relates generally to improvements to bar code scanners and bar code scanning. More particularly, the invention relates to advantageous techniques for integrating elements of a detector assembly including a detector used to create a scanner signal based on light entering a scanner and striking the detector as result of reflections of a scan pattern from a bar code, with the light reaching the detector being restricted to a relatively narrow bandwidth.

BACKGROUND OF THE INVENTION

Bar code scanners often operate by generating a scan pattern produced by reflections of a laser beam from a rotating spinner and from a series of fixed mirrors. The scanner generates a scanner signal based on light that enters the scanner as a result of a reflection of the scan pattern from a bar code. The scan pattern is generated by reflections of a laser beam produced by a scanner laser, with the laser beam produced by the scanner laser being of a particular wavelength.

In order to detect and decode a bar code, the scanner employs a detector including a photodiode or other device that produces the scanner signal upon being struck by the reflections of the scan pattern from the bar code. As noted above, the scan pattern is made up of light produced by reflections of the scanner laser, and this light has a particular wavelength. The wavelength of light to be detected in order to produce the scanner signal is the wavelength of light produced by the scanner laser.

Therefore, it is highly desirable to limit the range of wavelengths of light permitted to strike the detector. It is highly desirable to restrict the wavelength of the light striking the detector to a relatively narrow range that includes the wavelength of light produced by the scanner laser. In addition to reflected light from bar codes, ambient light or light from other sources may enter the scanner and, if allowed to strike the detector, may produce spurious signals and otherwise degrade scanner performance. In order to reduce the effect of extraneous light, the detector is preferably accompanied by one or more optical filters that allow only a narrow range of wavelengths to reach the detector. A typical prior art detector assembly includes a detector comprising detector electronics such as a photodiode and other accompanying electronics. The detector is typically encapsulated in clear plastic. A low pass filter comprising a hot mirror on a glass substrate is affixed to the plastic capsule containing the detector. A hot mirror is an infrared filter that reflects heat energy and admits visible energy. Typical bar code scanners employ lasers producing light having a wavelength in the red region of the visible spectrum, and a hot mirror can be selected that will admit light within this region while also excluding extraneous infrared radiation.

A high pass filter comprising a molded plastic hemispherical lens impregnated with a dye is affixed to the low pass filter. The plastic capsule, the high pass filter and the low pass filter are typically cemented to one another using an index matching epoxy, that is, an epoxy having an index of refraction at or close to the index of refraction of the elements being joined. The use of an index matching epoxy reduces or eliminates reflections that would otherwise be cause by a mismatch between indices of refraction between the epoxy and the elements. The combined effect of the filters is to admit light in a relatively narrow range of wavelengths including the wavelength of the laser used in the scanner, while blocking other ultraviolet, visible and infrared wavelengths that would add unwanted signal and noise effects.

The prior art detector assembly described above presents four optical interfaces to light directed toward the detector. These optical interfaces are the passage from the surroundings to the front of the hemispherical high pass filter, from the high pass filter to the front of the low pass filter, from the front of the low pass filter to the back of the low pass filter and from the back of the low pass filter to the detector surface. Each interface can introduce alignment error and optical loss. In addition, the hemispherical lens is subject to scratching. Moreover, the construction of the detector assembly from several different components introduces cost and complexity to the design. There exists, therefore, a need for a design for a detector assembly for use in a scanner that reduces the number of optical interfaces, that protects the surfaces of the assembly from damage and that allows a relatively simple and low cost construction of the assembly.

SUMMARY OF THE INVENTION

A detector assembly according to an aspect of the present invention comprises a molded plastic capsule enclosing a detector. The detector produces a scanner signal when struck by light resulting from the reflection of a scan pattern by a bar code. The plastic capsule is preferably molded around the detector, so that the detector is seamlessly enclosed within the capsule. The capsule includes a hemispherical lens element that is molded as part of the capsule. The plastic from which the capsule is molded is impregnated with a dye chosen to provide filtering characteristics so as to admit a range of wavelengths including the wavelength of light making up the scan pattern.

Once the capsule has been formed, the hemispherical lens element is coated with a coating material chosen to provide filtering characteristics complementary to those of the filtering characteristics of the capsule. The combined filtering characteristics provided by the coating material and the plastic capsule admit light within a range of wavelengths including the wavelength of light making up the scan pattern, and block light having a wavelength above or below the range. The coating is also preferably of a material selected to provide protection against scratches for the hemispherical lens.

A more complete understanding of the present invention, as well as further features and advantages of the invention, will be apparent from the following Detailed Description and the accompanying drawings.

BRIEF DESCRIPTION OF THE DRAWINGS

FIG. 2 illustrates a process of detector fabrication according to an aspect of the present invention.

DETAILED DESCRIPTION

Figure 1:
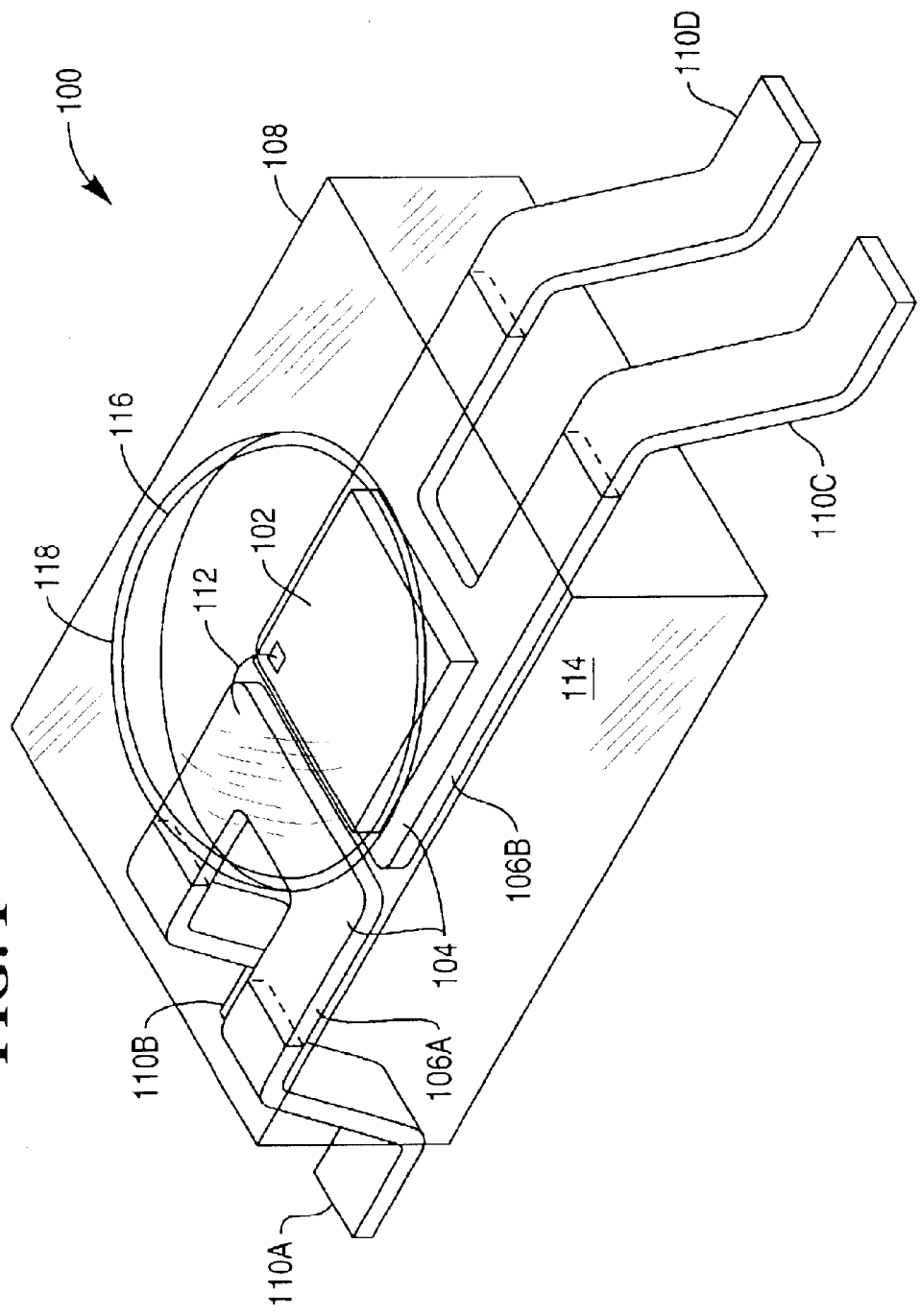
FIG. 1 illustrates a detector assembly according to an aspect of the present invention.

FIG. 1A illustrates a perspective view of a detector assembly 100 according to an aspect of the present invention. The detector assembly 100 includes a detector 102, suitably mounted on a leadframe 104. The leadframe comprises a first section 106A and a second section 106B, and the detector 102 and leadframe 104 are encased in a plastic capsule 108. The leadframe 104 provides support and electrical connectivity for the detector 102. The first section 106A of the leadframe 104 includes leads 110A and 110B, extending out of the plastic capsule 108 and adapted to mount the detector assembly 100 into a scanner. The first section 106A provides a common, or ground, connection to the detector 102. The first section 106A is connected to the detector 102 by a wire 112. The second section 106B of the leadframe 104 includes leads 110C and 110D, also extending out of the plastic capsule 108 and adapted to mount the detector assembly 100 into a scanner. The leads 110C and 110D provide a connection for the output signal of the detector 102 to processing electronics within the scanner in which the detector assembly 100 is mounted. Each of the sections 106A and 106B of the leadframe 104 may initially be straight while the detector 102 is being mounted on the leadframe 104 and while the plastic capsule is being molded around the detector 102 and the leadframe 104. Then, once molding is complete, the leads 110A–110D may be shaped as desired.

The plastic capsule 108 includes a rectangular section 114 and a hemispherical lens element 116, both of which are integral parts of the plastic capsule 104 and result from the shape taken by the plastic capsule 108 during formation of the capsule, for example through molding. In the present view, the width from left to right of the rectangular section 105 may suitably be 0.340 inch, the width from front to back may suitably be 0.260 inch and the height may suitably be 0.100 inch. The hemispherical lens element 116 may suitably have a radius of 0.118 inch, and may be centered on the rectangular section 114.

The plastic capsule may suitably be formed of a clear epoxy, of polycarbonate, of polymethylmethacrylate (PMMA), or of any other suitable material providing desired physical and optical characteristics. Desired characteristics include a suitable index of refraction. In typical applications, an index of refraction of approximately 1.4 is desirable. Other desired characteristics include good clarity and the ability to withstand high temperatures such as those used in soldering processes.

The plastic capsule 108 is impregnated with a dye chosen to give the plastic capsule 108 the effect of a low pass filter, passing light having a wavelength below a predetermined value and blocking light having a wavelength above the predetermined value. The predetermined value is based on the wavelength of light produced by the scanner laser with which the detector assembly 100 is to be used.

In one suitable application of the detector assembly 100, the scanner laser with which the detector assembly 100 is used produces a laser beam having a wavelength of 670 nm. In this application, therefore, the reflections to be detected have a wavelength of 670 nm. A suitable dye that can be used in such an application is ROHM HASS RED 461™. The material used to form the capsule 104 is preferably impregnated with the dye before the formation of the capsule 104.

Once the plastic capsule 108 is formed, the hemispherical lens element 116 is then coated with a suitable material so as to form a filter coating 118. The filter coating 118 is not shown to scale, but is exaggerated for purposes of illustration. The coating material used to form the filter coating is chosen to have the properties of an optical high pass filter, admitting light having a wavelength above a predetermined value and blocking light having a wavelength below the predetermined value. The coating material may suitably be chosen to provide scratch resistant properties, so that the presence of the filter coating tends to protect the lens element 116 from scratches. The filter coating may suitably be a multilayer dielectric, suitably formed or deposited on the lens element 116 by sputtering. Suitable materials of which the layers may be formed include quartz dioxide, titanium dioxide and tantalum pentoxide. These materials do not tend to absorb water, and they are very durable. Exemplary multilayer coatings include successive layers of quartz dioxide and titanium dioxide, or successive layers of quartz dioxide and tantalum pentoxide.

In order to apply a layer of coating material, the capsule 108 is placed in suitable environment, such as a chamber containing a nonreactive gas such as Argon gas. A sample of the coating material is introduced, or is already present in the chamber, suitably as part of an electrode. A charge is applied to the electrode in order to drive atoms of the coating material onto the capsule 108, until a layer of a desired thickness is formed. In order to insure that the filter coating is applied only to the lens element 116, a masking material is preferably applied to the capsule 108 before the capsule 108 is introduced into the chamber. The masking material is then removed before the detector assembly 100 is placed into use.

Each of the layers comprising the filter coating may suitably have a thickness of either one-fourth or one-half the wavelength of the scan pattern. Thus, in the case in which a laser emitting light having a wavelength of 670 nm is used to generate the light making up the scan pattern, each of the layers comprising the filter coating will have a thickness of either 167.5 nm or 335 nm. The layers may be composed of different materials contributing different properties, with the goal being to produce a filter coating producing a desired combined effect. In particular, the outermost layer or layers may be composed of a material harder than the material comprising the capsule 104 and thus the lens 106. The choice of a hard material for the outermost layers of the filter coating helps prevent scratches to the detector assembly 100 and in particular to the lens 106.

The combination of the optical properties of the filter coating and of the dye impregnating the plastic capsule 108 gives the lens element 116 the effect of a bandpass filter, because the filter coating blocks light having a wavelength below the predetermined value and the lens element 116 and plastic capsule 108, by virtue of the inherent properties imparted by the dye to the plastic material comprising the lens element 116 and the rest of the plastic capsule 108, block light having a wavelength above the specified value. The wavelength of the light reaching the detector 102 is therefore within a narrow range preferably centered on the wavelength of the scanner laser.

While the dye is described here as having low pass filtering properties and the filter coating is described as having high pass filtering properties, it will be recognized that the dye may be chosen to provide properties of a high pass filter and the coating material used to form the filter coating may be chosen to provide properties of a low pass filter. The combination of the filtering properties of the capsule 108 and the coating material provides bandpass filtering. One of the capsule 108 and the coating material provides high pass filtering and the other of the capsule 108 and the coating material provides low pass filtering, but which of the capsule 108 and the coating material and which provides low pass filtering need not be the same in all cases.

In contrast to the prior art detector assembly described in the Background of the Invention, the detector assembly 100 of FIG. 1 does not include a hot mirror separate from the plastic capsule. Moreover, the lens element 116 is an integral part of the plastic capsule 104 rather than a separate element. Therefore, no optical interfaces exist between the lens element 106 and the plastic capsule 104, and there is no hot mirror to present an optical interface between itself and the lens element 106 or between itself and the plastic capsule 104. The detector assembly 100 of FIG. 1therefore presents significantly fewer optical interfaces than does the typical prior-art detector assembly, and thus presents less danger of alignment error and less chance of optical loss. In addition, the filter coating 118 helps to provide scratch resistance, and the fabrication of the plastic capsule 108 and the lens element 116 as a single piece provides for an assembly that is relatively simple and inexpensive to fabricate and that has a reduced number of parts as compared to the prior art assembly described above.

FIG. 2 illustrates the steps of a process 200 of detector assembly fabrication according to an aspect of the present invention. At step 202, a pliable material, for example moldable plastic, is impregnated with a dye chosen so that the pliable material has a low pass optical filtering effect, that is, the pliable material admits light having a wavelength below a predetermined wavelength determined by the optical properties of the pliable material as imparted by the nature of the material itself and the properties given to the material by the dye. For example, for use with a laser emitting light having a wavelength of 670 nm, the dye with which the material is impregnated may suitably be ROHM HASS RED 461™. At step 204, the pliable material is shaped so as to form a capsule enclosing an optical detector that will produce an electrical signal in response to light directed to the detector as a result of a reflection of a scan pattern from a bar code. The detector is preferably secured on a leadframe including leads that will extend outside the capsule after shaping of the capsule, so as to allow electrical connection with the detector and mounting of the detector assembly. The shaping of the material includes shaping the material so that it has a desired size and shape and includes a hemispherical lens element positioned to focus light to the detector.

At step 206, the hemispherical lens element is coated with a filter coating chosen to have a high pass optical filtering effect, that is, to admit light having a wavelength above a predetermined value and to block light having a wavelength below the predetermined value, the predetermined value being chosen so that it is below but relatively close to a wavelength of a scanner laser with which the detector assembly is desired to be used. For example, for use with a scanner laser producing a wavelength of 670 nm, the filter coating may block light having a wavelength below 635 nm. While the process of fabrication discussed above employs a dye giving a low pass filtering effect and a filter coating giving a high pass filtering effect, it will be recognized that the dye may also be chosen to give a high pass filtering effect and the coating material chosen to give a low pass filtering effect. At step 208, the leads are suitably shaped for mounting of the assembly within a scanner.

While the present invention is disclosed in the context of a presently preferred embodiment, it will be recognized that a wide variety of implementations may be employed by persons of ordinary sill in the art consistent with the above discussion and the claims which follow below.

We claim:

1. A detector assembly for creating a scanner signal in response to light reflected from a scan pattern by a code, the scan pattern consisting of light having a defined wavelength, comprising:

a light sensitive detector operative to generate a signal in response to light striking the detector;

a capsule surrounding the detector, the capsule being formed of a material providing an optical filtering effect so as to admit light having a wavelength in a range bounded by a predetermined value, with the predetermined value being based on the wavelength of the light making up the scan pattern and chosen to allow admission of light within a range including the wavelength of the light making up the scan pattern; and a coating on a portion of the capsule, the coating being formed of a material providing an optical filtering effect so as to admit light having a wavelength within a range bounded by a predetermined value, with the predetermined value being based on the wavelength of the light making up the scan pattern and chosen to admit light within a range including the wavelength of the light making up the scan pattern, the filtering effect of the coating being complementary to that provided by the material forming the capsule such that the combined filtering effects of the coating and the material provided by the capsule create a bandpass filtering effect admitting light within a range of wavelengths bounded by the predetermined values defining wavelengths of light admitted by the coating material and the material forming the capsule.

2. The detector assembly of claim 1, wherein the capsule includes a hemispherical lens element to focus light onto the detector, the hemispherical lens element being an integrated part of the capsule and formed of the material making up the capsule.

3. The detector assembly of claim 2, wherein the coating is on the hemispherical lens element.

4. The detector assembly of claim 3, wherein the capsule is formed of molded plastic impregnated with a dye chosen to admit light within the desired range of wavelengths.

5. The detector assembly of claim 4, wherein the coating is a multilayer dielectric.

6. The detector assembly of claim 5, wherein the coating comprises a succession of layers.

7. The detector assembly of claim 6, wherein each layer of the succession of layers has a thickness of either one-half or one fourth of the wavelength of light making up the scan pattern.

8. The detector assembly of claim 7, wherein the layers are deposited on the hemispherical lens by sputtering.

9. The detector assembly of claim 8, where one or more of the layers is composed of a material harder than the material forming the capsule.

10. A method of fabricating a detector assembly for creating a scanner signal in response to light reflected from a scan pattern by a bar code, the scan pattern consisting of light having a defined wavelength, comprising the steps of:

treating a pliable material to create an optical filtering effect so that the material admits light having a wavelength in a range bounded by a predetermined value, with the predetermined value being based on the wavelength of the light making up the scan pattern and chosen to allow admission of light within a range including the wavelength of the light making up the scan pattern;

shaping the pliable material to form a capsule around the detector; and coating a portion of the capsule with a filter coating providing an optical filtering effect so as to admit light having a wavelength within a range bounded by a predetermined value, with the predetermined value being based on the wavelength of the light making up the scan pattern and chosen to admit light within a range including the wavelength of the light making up the scan pattern, the filtering effect of the coating being complementary to that provided by the pliable material such that the combined filtering effects of the filter coating and the pliable material create a bandpass filtering effect admitting light within a range of wavelengths bounded by the predetermined values defining wavelengths of light admitted by the filter coating and the pliable material.

11. The method of claim 10, wherein the step of treating the pliable material includes impregnating the pliable material with a dye.

12. The method of claim 11, wherein the step of forming the pliable material to form a capsule around the detector includes forming a hemispherical lens element as part of the capsule.

13. The method of claim 12, wherein the step of coating a portion of the capsule includes coating the hemispherical lens element with the filter coating.

14. The method of claim 13, wherein coating the hemispherical lens element with the filter coating comprises depositing a succession of layers on the hemispherical lens element.

15. The method of claim 14, wherein each layer of the succession of layers has a thickness either one-fourth or one-half the wavelength of the light making up the scan pattern.

16. A package for enclosing a light sensitive detector so as to restrict a wavelength of light reaching the detector, comprising:

a capsule surrounding the detector, the capsule being formed of a material providing an optical filtering effect so as to admit light having a wavelength in a range bounded by a predetermined value, with the predetermined value being based on the wavelength of the light making up the scan pattern and chosen to allow admission of light within a range including the wavelength of the light making up the scan pattern; and a coating on a portion of the capsule, the coating being formed of a material providing an optical filtering effect so as to admit light having a wavelength within a range bounded by a predetermined value, with the predetermined value being based on the wavelength of the light making up the scan pattern and chosen to admit light within a range including the wavelength of the light making up the scan pattern, the filtering effect of the coating being complementary to that provided by the material forming the capsule such that the combined filtering effects of the coating and the material provided by the capsule create a bandpass filtering effect admitting light within a range of wavelengths bounded by the predetermined values defining wavelengths of light admitted by the coating material and the material forming the capsule.

17. The package of claim 16, wherein the capsule includes a hemispherical lens element to focus light onto the detector, the hemispherical lens element being an integrated part of the capsule and formed of the material making up the capsule.

18. The package of claim 17, wherein the coating is on the hemispherical lens element.

19. The package of claim 18, wherein the capsule is formed of molded plastic impregnated with a dye chosen to admit light within the desired range of wavelengths.

20. The package of claim 19, wherein the coating is a multilayer dielectric.

* * * * *